Sept. 29, 1964 S. J. HYMAN 3,151,302
AUTOMATIC GAIN CONTROL CIRCUIT UTILIZING
VOLTAGE VARIABLE CAPACITOR
Filed Nov. 29, 1960

Inventor
Samuel J. Hyman
By Hofgren, Brady, Wegner,
Allen & Stellman
Attorneys

United States Patent Office 3,151,302 Patented Sept. 29, 1964

3,151,302

AUTOMATIC GAIN CONTROL CIRCUIT UTILIZING VOLTAGE VARIABLE CAPACITOR

Samuel J. Hyman, Chicago, Ill., assignor to The Hallicrafters Co., a corporation of Delaware Filed Nov. 29, 1960, Ser. No. 72,377
5 Claims. (Cl. 330—145)

This invention relates to a new and improved circuit for controlling the amplitude of the output signal from an amplifier or radio receiver, having a signal-handling channel, at a desired level regardless of the level of the incoming signal. The circuit employs an automatic gain control voltage that is responsive to the level of the incoming signal, varying directly therewith, and a variable impedance element responsive to the voltage to control the impedance of the signal-handling channel.

The purpose of automatic gain control circuits in radio receivers is to supply a control voltage which will act on the gain of an amplifier portion of the receiver, by varying the grid bias to control the operating point of the amplifier tube and maintain a constant level output signal from the receiver. In some situations, a simple gain control circuit is insufficient to give an adequate stable control of the output signal. The improved circuit of applicant's invention further characterizes the automatic gain control system by controlling the impedance of the signal-handling channel of a receiver in accordance with the automatic gain control potential to maintain a highly stable signal output level from the receiver.

A principal object of this invention is to provide a new and improved circuit for use in a radio receiver, having a signal-handling channel, to maintain a stable constant audio output signal level from the receiver regardless of a varying level of radio frequency signal received by the receiver.

Another object is to provide such a circuit having a reactive voltage divider in the signal-handling channel of the receiver, including a voltage sensitive variable element that is operably connected with a source of gain control voltage and which changes in value in response to a change in the control voltage.

Another object is to provide such a circuit with a first variable reactor element in the signal-handling channel, connected with a tuned amplifier portion of the receiver and responsive to the control voltage to maintain a constant level of output signal from the receiver, and a second variable reactive element connected with the first variable element and the tuned amplifier circuit, responsive to the control signal to maintain resonance in the tuned circuit.

Other features and advantages of the invention will readily be apparent from the following specification and drawings in which.

The circuits of FIGURES 1, 2 and 3 will now be described in some detail and values and type designations will be given for many of the circuit elements. It is to be understood that these specific values are given primarily for the purpose of disclosing operative embodiments of the invention and values are not to be considered critical. Many changes and modifications will readily be apparent to those skilled in the art.

Figure 1:
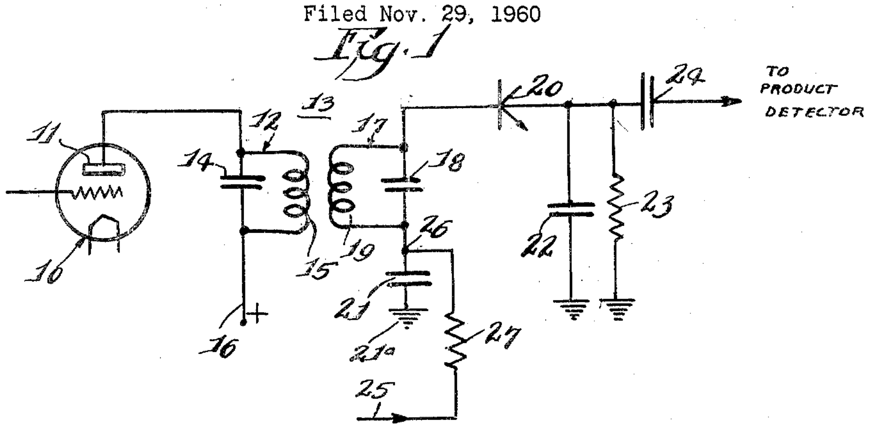
FIGURE 1 is a schematic diagram of an automatic gain control circuit embodying the invention.

Referring to FIGURE 1, an embodiment of the automatic gain control circuit comprises an amplifier tube 10, which may be the intermediate frequency output amplifier of a radio receiver, having a plate 11 to which is connected a tuned plate circuit 12, that includes the primary winding of a coupling transformer designated generally at 13, and consists of a capacitor 14, and an inductance 15. The tuned plate circuit 12 is connected to a source 16 of positive D.C. voltage that supplies voltage for the plate 11. A tuned secondary circuit 17 of the coupling transformer 13 consists of a capacitor 18 and an inductance 19. One side of tuned secondary circuit 17 is connected to a terminal of a variable capacitor 20, 47 μμf., (micro-microfarads), and the other side is returned through a capacitor 21, .001 μf., to a suitable reference, as ground *21a*. The other terminal of the variable capacitor 20 is connected through a capacitor 22, 47 μμf., to ground. The capacitors 20 and 22 form a voltage divider network across which the amplified output signal of amplifier 10 appears.

The variable capacitor 20 is a voltage sensitive variable capacitor and may be of a semi-conductor material, as the capacitor sold under the trademark "Varicap" by Pacific Semi-Conductors, Inc., Culver City, California. To give an idea of the range of capacity possible for this type of circuit, one such capacitor which may be assumed to have 100% or nominal capacity with an applied voltage of 4 volts has 210% capacity at 0.25 volt, and 60% capacity at 12 volts.

A resistor 23 is connected between the juncture of capacitors 20 and 22 to ground, and a coupling capacitor 24, .001 μf., has one terminal connected to the juncture of capacitors 20 and 22, and the other terminal connected to a further circuit, as a product detector circuit (not shown) of the radio receiver.

An automatic gain control voltage 25, responsive to the level of the signal received by the radio receiver and which may be obtained from any convenient place in the radio receiver, as the product detector, is applied to the juncture 26 of the tuned circuit 17 and the capacitor 22 through an isolating resistor 27.

In operation, a modulated radio frequency signal is received by the radio receiver, amplified by the amplifier 10 (and preceding amplifying stages) and appears across the tuned plate circuit 12. The signal is coupled through the transformer 13 and appears across the tuned secondary circuit 17 and the capacitor 21 and also across the voltage divider network comprising the capacitors 20 and 22. The signal then passes through the coupling capacitor 24 to a further stage, as the product detector of the receiver.

When the level of the received signal increases, the automatic gain control voltage 25 also increases proportionately, and is impressed upon the variable capacitor 20 through the resistor 27 and coil 19. The increased voltage on the variable capacitor 20 causes the capacitance thereof to decrease, increasing the capacitive reactance and causing a larger signal voltage drop thereacross. Since a greater voltage drop occurs across the variable capacitor 20, the signal voltage across the capacitor 22 is reduced, and the voltage level of the signal applied through coupling capacitor 24 to product detector is reduced, thereby tending to maintain a constant level signal output from the receiver.

Similarly, when the voltage level of the signal received by the receiver decreases, the corresponding decrease in the automatic gain control voltage 25 causes the variable capacitor 20 to increase in value, decreasing the capacitive reactance thereof and causing a smaller signal voltage drop thereacross resulting in an increased signal voltage level across the capacitor 22 to be applied to the product detector circuit.

Figure 2:
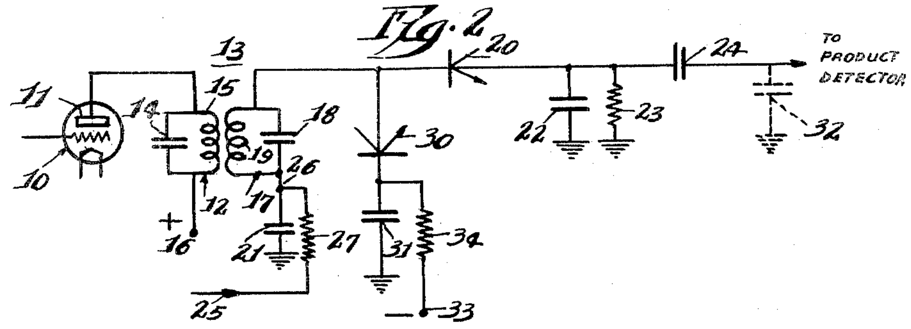
FIGURE 2 is a schematic diagram of a modified embodiment of the gain control circuit including detuning compensation for a tuned amplifier.

FIGURE 2 is a schematic diagram of a modification of applicant's automatic gain control circuit, that is essentially the same as the circuit shown in FIGURE 1 except that elements have been added to compensate for a detuning of the secondary circuit 17 when the variable capacitor 20 varies in capacitance. A second variable capacitor 30, 47 μμf., has one terminal connected to the juncture of the secondary circuit 17 and the variable capacitor 20, and the other terminal connected through a capacitor 31 to ground. The value of capacitor 31 is preferably 47 μμf. plus the shunt capacity of the product detector circuit, which is shown in dotted lines at 32 and represents the shunt capacity of the entire product detector circuit. A negative bias voltage 33 is applied through a resistor 34 to the juncture of capacitors 30 and 31. All of the other circuit elements and their values are the same as designated in FIGURE 1.

An increased voltage level of the signal received by the receiver will increase the automatic gain control voltage 25, and affect the value of the variable capacitor 20 to reduce the level of the signal applied to the product detector and maintain a constant level signal output from the receiver in the same manner described above. The increased voltage 25 will also appear at the variable capacitor 30, causing the total bias voltage 33 to decrease and the capacity of capacitor 30 to increase an amount sufficient to compensate for detuning of the secondary circuit 17 as caused by the change in value of the variable capacitor 20.

Figure 3:
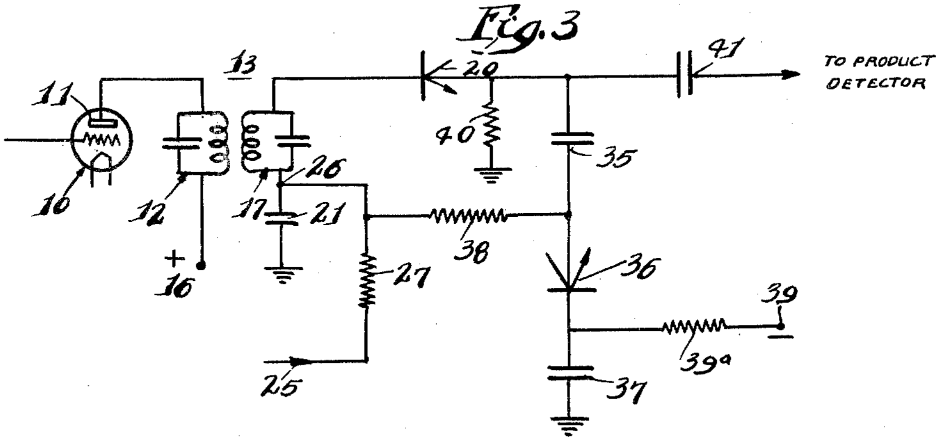
FIGURE 3 is a further modification of the gain control circuit that results in greater output signal control plus detuning compensation.

Another modificaiton of the automatic gain control circuit shown in FIGURE 3 provides for greater control of the output signal level and also compensates for the detuning of the secondary circuit 17. In FIGURE 3, the coupling transformer 13 is the same as shown in FIGURES 1 and 2 with one side of the secondary circuit 17 connected to one terminal of the variable capacitor 20 and the other side through a capacitor 21 to ground. The other terminal of the variable capacitor 20 is series connected with a capacitor 35, .001 μf., a variable capacitor 36, 47 μμf., and a capacitor 37, .001 μf., to ground. As in FIGURE 1, a control voltage 25 is applied through an isolating resistor 27 to the juncture point 26 of secondary circuit 17 and capacitor 21. A resistor 38, 1 megohm, is connected between the juncture 26 and the juncture of the capacitor 35 and the variable capacitor 36. A negative bias voltage 39 is applied to the juncture of the variable capacitor 36 and capacitor 37 through a resistor 39*a*, 1 megohm. A resistor 40 is connected from the other terminal of variable capacitor 20 to ground, and a coupling capacitor 41, .001 μf., is connected from the same terminal to the product detector of the receiver. The capacitors 20, 35, 36 and 37 form a voltage divider network in parallel with the tuned secondary circuit of the coupling transformer 13, across which the radio signal passing through the receiver appears.

When the level of the incoming signal increases, the increased automatic gain control voltage 25 is impressed on the variable capacitor 20 causing a decrease in the capacitance thereof, increasing the capacitive reactance and causing a greater voltage drop thereacross, so that the voltage level of the signal across the capacitors 35, 36 and 37 is reduced prior to being applied to the product detector circuit through the coupling capacitor 41. The control voltage 25 is also impressed on the variable capacitor 36 through the resistor 38, decreasing the total bias 39 on the variable capacitor 36, and decreasing the capacitive reactance thereof an amount equal to the increase in the capacitive reactance of the variable capacitor 20. This results in a further decrease in the signal voltage across the capacitors 35, 36 and 37, to provide greater control of the output signal. Since the value of the variable capacitor 20 is increased by the same amount that the value of variable capacitor 36 is decreased, in responding to the level of the control voltage, the net capacity of the voltage divider network remains unchanged and the secondary circuit 17 is not detuned. When a decrease occurs in the level of the signal received by the receiver the variable capacitor 20 increases in value, the variable capacitor 36 decreases in value an equal amount, and the output signal of the receiver remains at a constant predetermined level.

While I have shown certain embodiments of my invention, it is to be understood that it is capable of many modifications. Changes, therefore, in the construction and arrangement may be made without departing from the spirit and scope of the invention as disclosed in the appended claims.

I claim:

1. A radio receiver having an automatic gain control circuit, comprising: a source of received signal subject to amplitude variation; a signal handling channel connected with said source; a detector connected with said signal handling channel having a direct current output voltage the amplitude of which is a function of the amplitude of said received signal; a tuned circuit forming a part of said signal handling channel; a voltage divider connected in parallel with said tuned circuit and including a voltage variable capacitor, said voltage divider having an output which is a function of the capacity of said capacitor; means connecting said direct current detector output voltage with said voltage variable capacitor to vary the capacity thereof, controlling the output of said voltage divider in accordance with signal amplitude variation; and a second voltage variable capacitor connected with said tuned circuit and with the output of said detector and variable in inverse relation to variation of the capacity of said first voltage variable capacitor.

2. The automatic gain control circuit of claim 1 wherein said second voltage variable capacitor is connected in parallel with said voltage divider circuit.

3. The automatic gain control circuit of claim 1 wherein said second voltage variable capacitor is connected in series with said voltage divider circuit.

4. In a radio wave receiver including a source of signals subject to amplitude variations and a product detector having a direct current output voltage, the amplitude of which is a function of said signals, a variable impedance coupling circuit, comprising: a signal handling channel having an input connected with said signal source and an output connected with said product detector, said signal handling channel including a series leg and a shunt leg, said output being connected across said shunt leg; a voltage variable capacitor connected in one of said legs; a capacitor connected in the other of said legs, the amplitude of the output signal derived from the output of said channel being a function of the ratio of the capacity of said capacitors; and an automatic control circuit connecting the direct current output voltage of said product detector with said voltage variable capacitor to vary the capacity thereof, to control the output of the voltage divider with variations of the amplitude of said signal.

5. In a radio wave receiver including a source of signals subject to amplitude variations and a product detector having a direct current output voltage, the amplitude of which is a function of said signals, a variable impedance coupling circuit, comprising: means defining a reference potential; a coupling transformer having a primary winding connected with said signal source and having a secondary winding with two terminals; means connecting one of said terminals with said reference potential; a voltage variable capacitor connected with the other terminal of said secondary winding; a capacitor connected in series with said voltage variable capacitor and returned to said reference potential; an output circuit connected with the junction between said voltage variable capacitor and said series connected capacitor, said output circuit being connected with said product detector; and an automatic control circuit connecting the direct current output voltage of said product detector with said voltage variable voltage capacitor.

(References on following page)

References Cited in the file of this patent

UNITED STATES PATENTS

| | | |
|---|---|---|
| Re. 20,442 | Ballantine | July 13, 1937 |
| 2,330,499 | Lehfeldt | Sept. 28, 1943 |
| 2,659,039 | Bourgonnier et al. | Nov. 10, 1953 |
| 2,768,248 | Harris | Oct. 23, 1956 |
| 2,790,970 | Kodama | Apr. 30, 1957 |
| 2,936,428 | Schweitzer | May 10, 1960 |
| 2,971,164 | Saari | Feb. 7, 1961 |
| 3,079,571 | Elliott et al. | Feb. 26, 1963 |
| 3,093,802 | Chow | June 11, 1963 |

OTHER REFERENCES

Electronic Industries, December 1959, by McMahon and Chase, "Voltage-Variable Capacitors—State of the Art," pages 90–93.